United States Patent [19]

Wert et al.

[11] Patent Number: 5,247,207
[45] Date of Patent: Sep. 21, 1993

[54] SIGNAL BUS LINE DRIVER CIRCUIT

[75] Inventors: Joseph D. Wert; Timothy D. Davis, both of Arlington, Tex.

[73] Assignee: National Semiconductor Corporation, Santa Clara, Calif.

[21] Appl. No.: 869,214

[22] Filed: Apr. 13, 1992

Related U.S. Application Data

[63] Continuation of Ser. No. 784,610, Oct. 29, 1991, abandoned, which is a continuation of Ser. No. 453,984, Dec. 20, 1989, abandoned.

[51] Int. Cl.[5] .................... H03K 3/01; H03K 19/02
[52] U.S. Cl. ..................... 307/270; 307/310; 307/446; 307/491; 307/263; 307/540; 307/570
[58] Field of Search ............. 307/310, 443, 446, 491, 307/270, 263, 540, 309, 315, 591, 570

[56] References Cited

U.S. PATENT DOCUMENTS

| | | | |
|---|---|---|---|
| 3,979,607 | 9/1976 | Beelitz et al. | 307/300 |
| 4,303,841 | 12/1981 | Baker | 307/315 |
| 4,538,076 | 8/1985 | Shimada | 307/315 |
| 4,616,144 | 10/1986 | Hideshima et al. | 307/300 |
| 4,701,635 | 10/1987 | Kawazoe et al. | 307/315 |
| 4,798,977 | 1/1989 | Sakui et al. | 307/446 |
| 4,871,928 | 10/1989 | Bushey | 307/446 |
| 4,940,910 | 7/1990 | Jiang | 307/591 |
| 4,948,994 | 8/1990 | Akioka et al. | 307/315 |
| 5,105,103 | 4/1992 | Neu | 307/570 |

Primary Examiner—Margaret R. Wambach
Attorney, Agent, or Firm—Limbach & Limbach

[57] ABSTRACT

A signal line driver circuit having an input signal buffer and an open collector output circuit configuration and a method are provided for receiving an input signal and causing the output to pull down the voltage potential of a signal bus line while sinking an output current therefrom at a substantially constant output voltage with a substantially constant input-to-output signal propagation delay variation over variations in operating temperatures. A portion of the output current which is to be sunk from the signal bus line is advantageously used as the current supply for the input signal buffer circuitry. The input signal buffer circuitry uses metal oxide semiconductor field effect transistors in parallel with a bipolar junction transistor to take advantage of their mutually inverse conductivity vs. temperature characteristics, thereby ensuring that the output current sinking capability, output voltage range and input-to-output signal propagation delay variation remain substantially constant over a wide operating temperature range.

28 Claims, 3 Drawing Sheets (PRIOR ART)
FIG. 1

SIGNAL BUS LINE DRIVER CIRCUIT

This is a continuation of co-pending application Ser. No. 07/784,610 filed on Oct. 29, 1991, now abandoned which is a continuation of Ser. No. 07/453,984 filed on Dec. 20, 1989, now abandoned.

BACKGROUND OF THE INVENTION

1. Field of the Invention

The present invention relates to digital signal buffer amplifiers, and in particular, to digital signal line drivers having an open collector output circuit configuration for sinking an output current and/or wired-OR operation. The present invention further relates to a method of buffering a digital signal and sinking an output current.

2. Description of the Prior Art

Digital signal systems, particularly computers and signal processors, typically communicate their binary instructions and data over some form of shared signal line. Such a shared signal line is often referred to as a "bus," typically consisting of hard-wired connections between the digital signal subsystems which communicate thereby. A bus configuration is preferred so as to minimize interconnections between the various digital signal subsystems.

Figure 1:
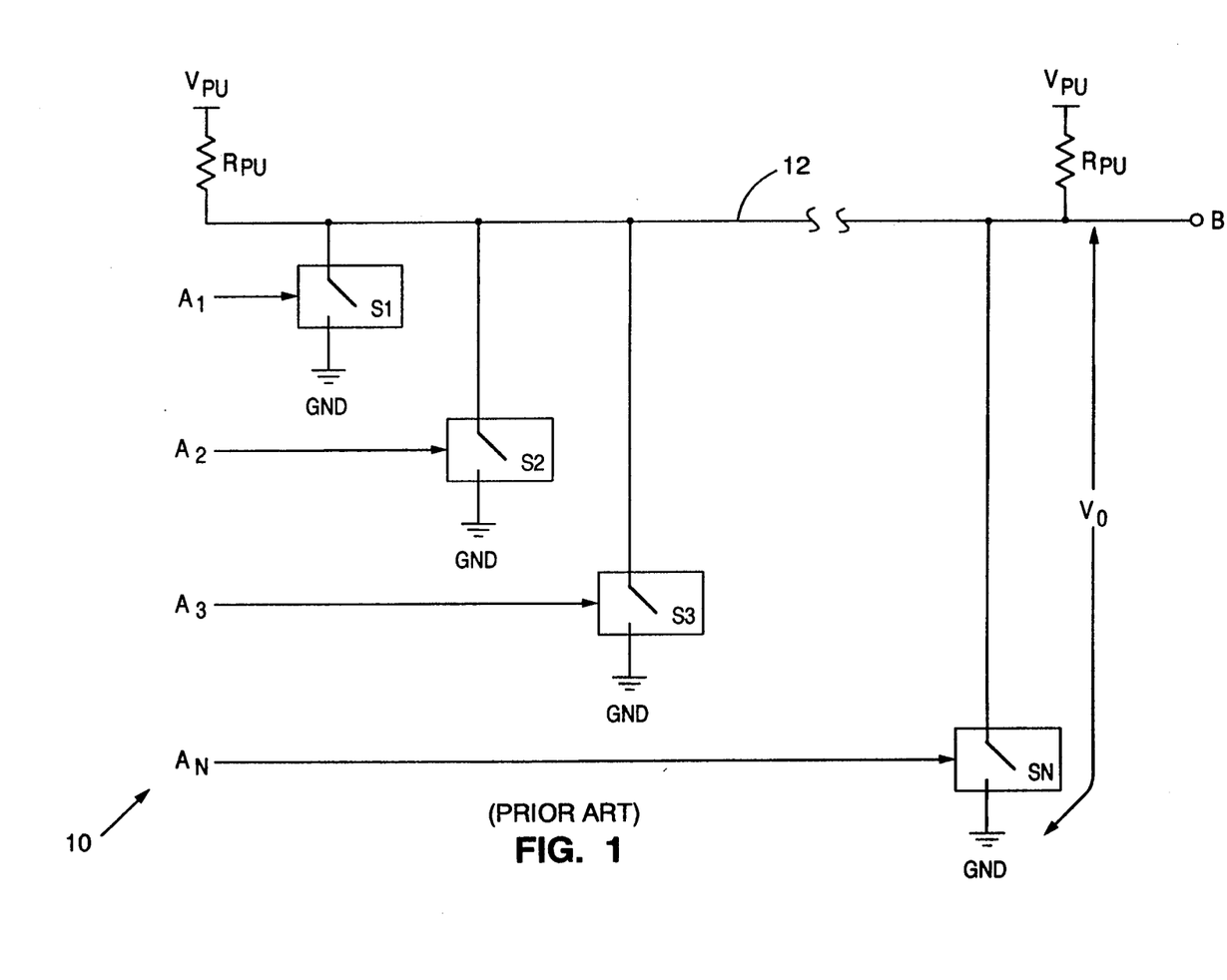
FIG. 1 illustrates, in simplified, combination schematic and functional block diagram form, an example of a signal bus line in a wired-OR configuration.

An example of a signal bus line configured for wired-OR operation is illustrated in FIG. 1. This type of bus line configuration 10 consists of a shared signal line 12 pulled up by a pullup voltage $V_{PU}$ via pullup resistors $R_{PU}$. The digital signal subsystems communicating over the bus line 12 do so by applying their respective output signals $A_1-A_n$ to circuits $S_1-S_n$ constituting the functional equivalents of electrical switches. When an output signal $A_m$ (m = 1, 2, 3, ..., n) is active (e.g., a logical "one"), its associated switch $S_m$ closes, thereby shorting the bus line 12 to circuit ground. This pulls the bus line 12, and therefore the bus line output signal B (e.g., output voltage $V_0$), down to a logical "zero."

The bus line configuration 10 of FIG. 1 is a wired-OR configuration. Whenever any of the individual digital subsystem output signals $A_m$ become active (i.e., $A_1$ or $A_2$ or $A_3$ or ... or $A_n$), the associated switch $S_m$ pulls the bus line 12 down to a logical zero. Such a configuration 10 is sometimes referred to as "backplane logic" since the backplane wiring interconnecting the switches $S_1-S_n$ and thereby constituting the bus line 12 is actually part of the logic constituting the wired-OR configuration 10.

In a wired-OR logic configuration 10 such as that illustrated in FIG. 1, the circuit constituting a switch $S_m$ typically has an open collector output circuit configuration. The collector of the output transistor is coupled directly to the bus line 12 and the emitter is coupled to circuit ground. When the circuit's driving signal $A_m$ is active, the output transistor is turned on in its saturated mode and its collector-to-emitter voltage ("Vcr") becomes virtually zero, thereby causing its collector to pull the bus line 12 down to a logical zero.

In the bus line configuration 10 of FIG. 1, the pullup voltage $V_{PU}$ is typically two volts and two pullup resistors $R_{PU}$ are used, each being in the range of 30–40 ohms and physically located near opposing ends of the backplane wiring constituting the bus line 12. A typical configuration 10 includes 32 switches $S_m$ (i.e., m = 32) and each switch $S_m$ must be capable of sinking up to 100 milliamperes of current from the bus line 12 at a low output voltage $V_0$. Therefore, under dynamic circuit 10 operating conditions, regardless of whether only one or all 32 switches $S_m$ are active, the pullup resistors $R_{PU}$ with values in the range of 30–40 ohms will substantially match the bus line 12 to the net circuit impedance presented by the switches $S_m$.

Figure 2:
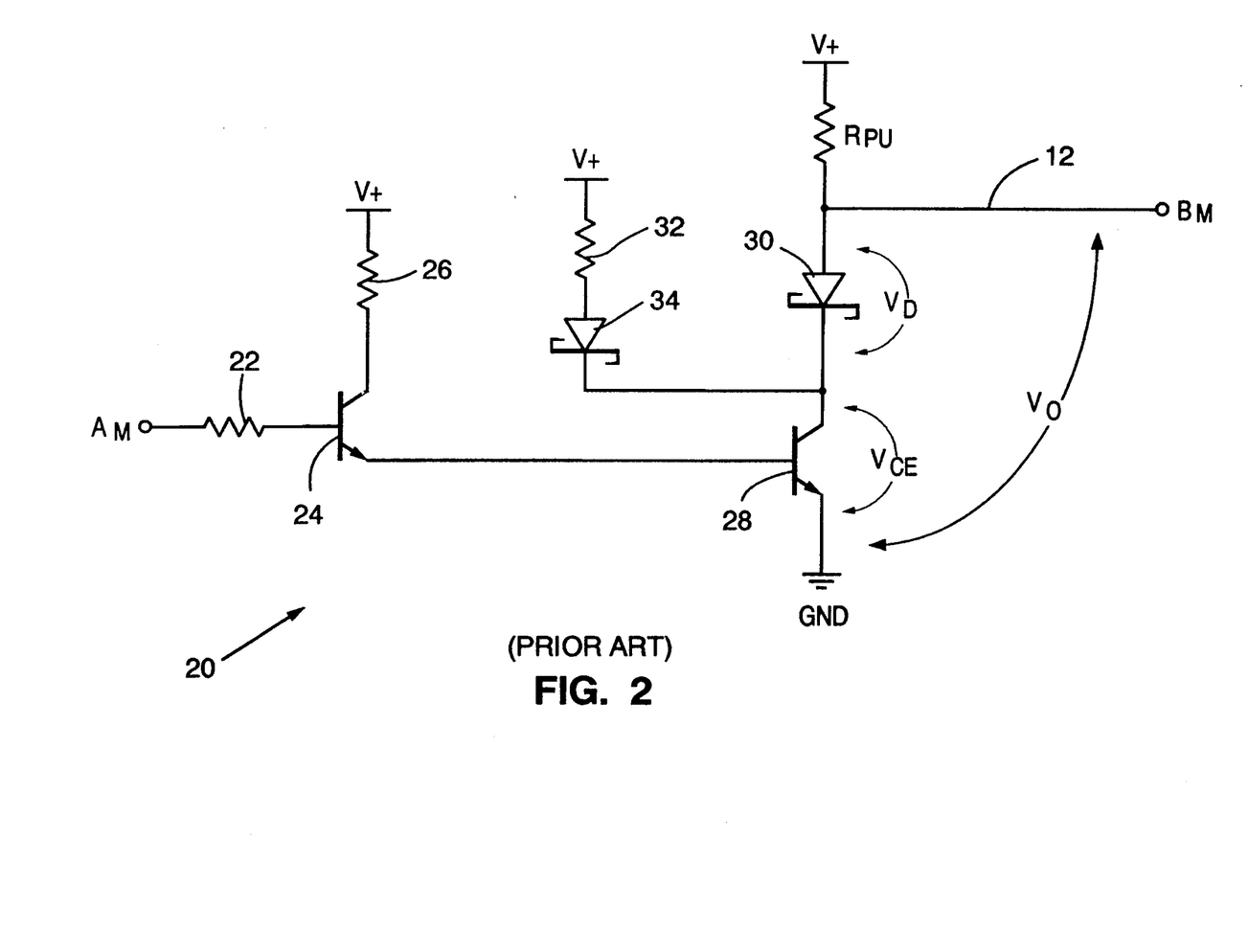
FIG. 2 illustrates in schematic form an example of a signal bus line driver having an open collector output circuit configuration.

An example of a transistor-transistor logic ("TTL") circuit constituting a switch $S_m$ is illustrated in FIG. 2. This bus line driver circuit 20 consists of: an input resistor 22; an input bipolar junction transistor ("BJT") 24; a biasing resistor 26; an output BJT 28; an output isolation diode 30; an output pullup resistor 32; and an output pullup diode 34. The input signal $A_m$ is a voltage having nominal TTL values. The output signal $B_m$ has an output voltage $V_o$ having a logical zero value of approximately 800 millivolts which is primarily dependent upon the conduction characteristics of the output isolation diode 30 and output BJT 28, and a logical one value of approximately two volts which is primarily dependent upon the pullup voltage $V_{PU}$ of the bus line 12. The biasing resistor 26 and output pullup resistor 32 are pulled up to a supply voltage V+, which is typically five volts for TTL types of signals.

When the input signal $A_m$ is inactive, i.e., at a logical zero (e.g., a TTL "low" of approximately zero volts dc), no input current flows through the input resistor 22 into the base of the input BJT 24. Thus, the input BJT 24 is turned off and no emitter current flows therefrom, and therefore, no base current flows into the output BJT 28. With no base current, the output BJT 28 is also turned off.

With the output BJT 28 turned off, the output voltage $V_o$ is at a logical one, the voltage value for which is determined by the pullup voltage $V_{PU}$ for the bus line 12. This is because the output pullup voltage V+ is higher than the pullup voltage $V_{PU}$ for the bus line 12, which causes the output pullup diode 34 to be forward-biased but the output isolation diode 30 to be reverse-biased. The reverse-biased output isolation diode 30 causes the bus line 12 to see a virtual open circuit at the anode of the output isolation diode 30.

When the input signal $A_m$ is active, i.e., at a logical one (e.g., a TTL "high" of approximately two volts dc), an input current flows through the input resistor 22 into the base of the input BJT 24. This turns the input BJT 24 on, resulting in emitter current flowing therefrom, and therefore, base current flowing into the output BJT 28. With sufficient base current, the output BJT 28 turns on in a saturated mode, thereby causing its voltage at its collector $V_{CE}$ to represent a logical zero. Based upon the known and/or designed electrical operating characteristics of the BJTs 24, 28 and the level of the input signal $A_m$, appropriate values for the input 22 and biasing 26 resistors can be selected so as to cause the output BJT 28 to turn on in its saturated mode.

With the output BJT 28 turned on in its saturated mode, its output voltage $V_{CE}$ is at a logical zero and current flows into its collector. This collector current is the sum of the currents flowing through the output pullup diode 34 and output isolation diode 30, which are now forward-biased by their respective pullup voltages V+, $V_{PU}$. Thus, with the output isolation diode 30 and output BJT 28 both turned on, the output voltage $V_0$ becomes a logical zero, the value for which is determined by the "on" voltage $V_D$ of the output isolation diode 30 and the saturated output voltage $V_{CE}$ of the output BJT 28. The output isolation diode 30 typically consists of a Schottky diode. Therefore, the output voltage $V_0$ is typically less than one volt.

The output isolation diode 30 is connected as shown in order to reduce the capacitive loading of the bus line 12 otherwise caused by the collector of the output BJT 28. As described above, when the circuit 20 is in its "off" state the output pullup voltage $V+$ causes the output isolation diode 30 to be reverse-biased. When the diode is reverse-biased its depletion region at its p-n junction becomes wider, and therefore, its p-n junction's capacitance is reduced. With this reduced capacitance, the capacitive load on the bus line 12, as presented thereto by the "off" output isolation diode 30, is reduced. Thus, the signal line driver circuit 20 of FIG. 2 presents minimal capacitive loading to the bus line 12.

Using a signal line driver circuit 20 as shown in FIG. 2 presents three problems. First, to effectively sink current from the bus line 12 at a low output voltage $V_0$, the output BJT 28 must operate in a fully saturated mode. This requires that a significant base current be supplied to the output BJT 28, which in turn, requires a significant emitter current from the input BJT 24. Therefore, the power supply providing the biasing voltage $V+$ must provide a significant current to the collector of the input BJT 24. This significant collector current is multiplied many times in practice since a typical digital system uses many circuits 20 of the type illustrated in FIG. 2. Thus, this power supply must have the capability of supplying a large current.

Having the capacity to produce a large supply current makes a power supply much more expensive. Moreover, as the current capacity increases, the waste heat generated as a result can increase exponentially. This results in greater cooling requirements which in turn often results in greater unit weight due to heavier heatsinks and larger blowers. Hence, the greater the current capacity is, the more expensive, hotter and heavier the power supply must be.

Second, as is well known in the art, the conductivity of a BJT varies proportionately with temperature. Therefore, at low temperatures the conductivity of a BJT is substantially reduced. This causes the BJT's forward-bias, base-emitter junction voltage ("$V_{BE}$") to increase. This in turn causes the forward biasing of the base-emitter junction, for a given base current, to decrease, thereby producing a decrease in the collector and emitter currents. This further in turn causes the collector-emitter voltage ("$V_{CE}$") of the BJT to increase.

Therefore, at low temperatures, the output voltage $V_0$ of the circuit 20 increases since the output voltage $V_{CE}$ of the output BJT 28 increases, as described above. This is undesirable since often the specified voltage range of the circuit output voltage $V_0$ is quite narrow, and frequently has a maximum value which may easily be exceeded when the transistor's output voltage $V_{CE}$ increases at low temperatures.

Third, due to the temperature dependent conductivities of the BJTs 24, 28 and the corresponding variations in the $V_{BE}$ for each, the input-to-output signal propagation delay also varies with temperature. In other words, as the operating temperature varies, the time difference between when input signal $A_m$ becomes active and when the output BJT 28 turns on (i.e., the input-to-output signal propagation delay) also varies. Typically, over the operating temperature range of $-55°$ C. to $+125°$ C. the input-to-output signal propagation delay variation will be in the range of 4-5 nanoseconds. This amount of variation may be undesirable, particularly if the circuit 20 must operate at high frequency.

SUMMARY OF THE INVENTION

The signal line driver circuit and method of the present invention take advantage of the fact that power supply current for the circuitry driving the output transistor is needed only when current from the signal bus line is being sunk by the output transistor. Thus, rather than draw current from an external power supply while at the same time wasting all of the current from the signal bus line by merely sinking it all to ground via the output transistor, the signal line driver circuit and method of the present invention use some of the current from the signal bus line to drive the output transistor into saturation so as to sink the remainder of the bus line current to circuit ground. In other words, the current supply requirement is substantially reduced by diverting and using a portion of the output current which is to be merely sunk to circuit ground anyway to drive the output stage performing the current sinking.

The signal line driver circuit and method of the present invention further take advantage of the fact that the conductivity of a bipolar junction transistor ("BJT") varies inversely with respect to the conductivity of a metal oxide semiconductor field effect transistor ("MOSFET") over temperature. Thus, the signal line driver circuit and method of the present invention use a MOSFET in parallel with a BJT for sourcing the base current for the output transistor. At low temperatures, where the conductivity of the BJT is low, the conductivity of the MOSFET is high. Conversely, at high temperatures, where the conductivity of the BJT is high, the conductivity of the MOSFET is low. Therefore, as the operating temperature varies and the conductivities of the BJT and MOSFET vary inversely with respect to one another, the resulting current provided by them to the base of the output BJT remains substantially constant. Furthermore, the time needed for this resulting current to appear after the input signal becomes active also remains substantially constant. This results in a substantially constant output voltage across the output BJT and on the signal bus line, and a substantially constant input-to-output signal propagation delay over variations in operating temperature.

These and other objectives, features and advantages of the present invention will be more readily understood upon consideration of the following detailed description of certain preferred embodiments and the accompanying drawings.

DETAILED DESCRIPTION OF THE INVENTION

Figure 3:
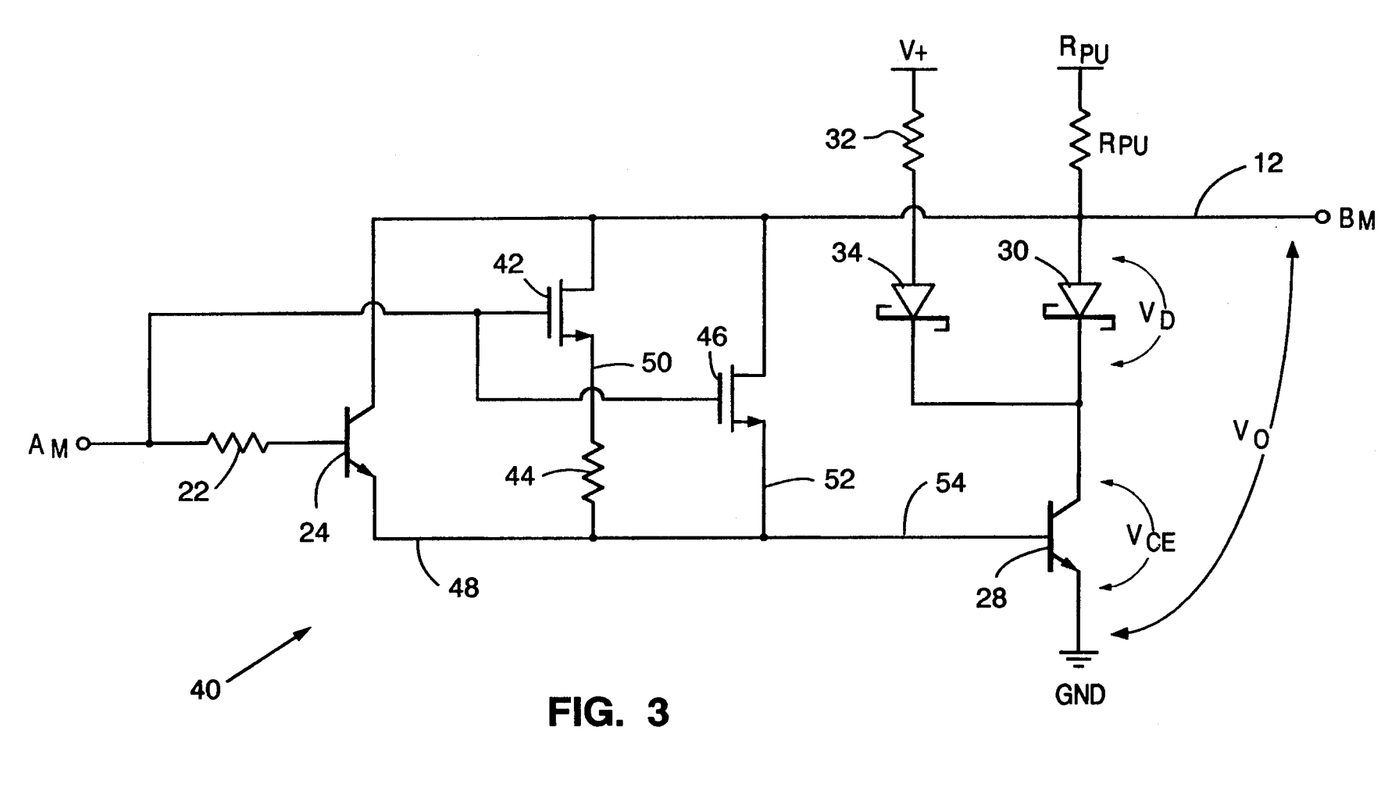
FIG. 3 illustrates in schematic form a preferred embodiment of the signal line driver circuit of the present invention.

FIG. 3 illustrates in schematic form a preferred embodiment of the signal line driver circuit 40 of the present invention (connected to a signal bus line 12 as discussed above). This circuit 40 includes: an input resistor 22; an input bipolar junction transistor ("BJT") 24; an input metal oxide semiconductor field effect transistor ("MOSFET") 42; a current limit resistor 44; an auxiliary MOSFET 46; an output BJT 28; an output isolation diode 30; an output pullup resistor 32; and an output pullup diode 34.

When the input signal $A_m$ is inactive, i.e., at a logical zero, and the circuit 40 is in its "off" state, the signal bus line 12 is pulled up by its pullup voltage $V_{PU}$ and the output is isolated by the output isolation diode 30 as described above for the circuit of FIG. 2. However, when the input signal $A_m$ is active, i.e., at a logical one, and the circuit 40 is in its "on" state, the objects and advantages of the signal line driver circuit 40 of the present invention become readily apparent.

When the input signal $A_m$ is active, its positive voltage representing a logical one is applied simultaneously to the input resistor 22 and the gates of the input 42 and auxiliary 46 MOSFETs. This produces a current flow through the input resistor 22 and into the base of the input BJT 24, thereby producing an emitter current 48 from the input BJT 24. This positive voltage signal $A_m$ at the gates of the MOSFETs 42, 46 further produces currents 50, 52 flowing through their N-channels and from their respective source terminals. (The MOSFETs 42, 46 are each an N-channel enhancement type of MOSFET. Thus, as will be readily appreciated by one of reasonable skill in the art, a voltage applied to the gate of such a device which is sufficiently positive with respect to the source, i.e., greater than the turn-on threshold voltage, will produce a current flowing through the drain-source channel and out of the source terminal.) These three currents 48, 50, 52 sum together to form a single base current 54 to drive the output BJT 28

As illustrated in FIG. 3, the collector of the input BJT 24 and drains of the MOSFETs 42, 46 are all coupled to and receive their current supply via the signal bus line 12. As discussed above, when the input signal $A_m$ is inactive, the circuit 40 is in its "off" state and requires no supply current for driving the output BJT 28. When the input signal $A_m$ is active and the circuit 40 is in its "on" state, the now conductive input BJT 24 and MOSFETs 42, 46 divert from the signal bus line 12 some of that current which would otherwise be merely shunted to ground through the output isolation diode 30 and output BJT 28.

At very low temperatures (e.g., $-55°$ C.) the conductivity of the input BJT 24 is quite low. Its base-emitter junction conduction curve shifts such that the turn-on threshold voltage for the base-emitter junction increases. Therefore, its emitter current 48 at a given base-to-emitter bias voltage ("$V_{BE}$") is substantially reduced. However, at such low temperatures, the conductivities of the MOSFETs 42, 46 are relatively high. In other words, at low temperatures and a given gate-to-source bias voltage ("$V_{GS}$"), the drain current ("$I_D$") of a MOSFET is high since its transconductance ($I_D/V_{GS}$) is high. (Conversely, at high temperatures, the inverse is true.) Therefore their source currents 50, 52 are more substantial. Hence, the resulting current sum 54 remains high enough to provide sufficient base current for the output BJT 28 to remain in saturation. Thus, at lower temperatures, the "saturation" base current 54 of the output BJT 28 is primarily dependent upon the source currents 50, 52 of the MOSFETs 42, 46.

The current limit resistor 44 is included in the source circuit of the input MOSFET 42 so as to prevent an excessive current from flowing through the input MOSFET 42. This current limit resistor 44 typically has a value on the order of tens of ohms.

As per the discussion above, at very low temperatures, the conductivity of the input MOSFET 42 is quite high, thereby allowing a potentially large source current 50 to flow therefrom. Without a current limit resistor 44, this source current 50 could be excessive and, if allowed to reach the output BJT 28 as its base current 54, could overdrive the output BJT 28, causing it to saturate too deeply, too quickly. If the output BJT 28 is driven into deep saturation too quickly, signal reflections are produced on the signal bus line 12 and "ringing" will occur. This "ringing" (an undesired, exponentially decaying, oscillating high frequency signal), if allowed to occur, is often of such magnitude that the "ringing" falsely appears to be an actual signal. This is undesirable since other subsystems (not shown) sharing the signal bus line 12 often use voltage comparators (not shown) which are triggered by the signals appearing thereon. If the "ringing" falsely appears as a signal, those comparators may be falsely triggered. Furthermore, the "ringing" often lasts so long, i.e., decays so slowly, that the true, desired signal is obscured.

The auxiliary MOSFET 46 is a lower power device with a lower turn-on threshold voltage than the input MOSFET 42. In an integrated version of this circuit 40, the auxiliary MOSFET 46 is a physically smaller device than the input MOSFET 42. The auxiliary MOSFET 46 is included in parallel with the input MOSFET 42 for contributing its source current 52 to the base current 54 of the output BJT 28 during the initial turn-on of the circuit 40. As the input signal $A_m$ goes from its inactive state to its active state, i.e., goes from a logical zero to a logical one, the finite rise time of the input signal $A_m$ and the higher turn-on threshold voltage of the larger input MOSFET 42 prevent a source current 50 from the input MOSFET 42 from immediately flowing. The smaller auxiliary MOSFET 46, having a lower turn-on threshold voltage, produces its source current 52 sooner. Therefore, a base current 54 becomes available earlier for the output BJT 28 to begin entering saturation. Thus, the time delay between when the input signal $A_m$ becomes active and when the output BJT 28 enters saturation, i.e., the input-to-output signal propagation delay, remains substantially constant.

As the source current 52 of the auxiliary MOSFET 46 nears its maximum value, the input MOSFET 42 has become conductive and has begun to produce its source current 50. Therefore, when the source current 52 of the auxiliary MOSFET 46 can increase no more, sufficient source current 50 is available from the input MOSFET 42 to drive the output BJT 28. The net result from this is that the base current 54 for the output BJT 28 becomes available virtually immediately as the input signal $A_m$ becomes active and may increase as necessary to maintain saturation of the output BJT 28.

At higher temperatures where the conductivity of the input BJT 24 is better and its turn-on threshold voltage for its base-emitter junction is reduced, its emitter current 48 becomes available earlier as the input signal $A_m$ becomes active. Thus, the input-to-output signal propagation delay, as discussed above, remains substantially constant.

Furthermore, at higher temperatures, the conductivities of the input BJT 24 and auxiliary MOSFET 46 increase and decrease, respectively, thereby causing their emitter 48 and source 52 currents to increase and decrease, respectively. Therefore, at higher temperatures, as the input signal $A_m$ becomes active, the "early" base current 54 of the output BJT 28 becomes more dependent upon the emitter current 48 of the input BJT 24 than upon the source current 52 of the auxiliary MOSFET 46.

Furthermore, at higher temperatures, where the conductivities of the input BJT 24 and input MOSFET 42 increase and decrease, respectively, their emitter 48 and source 50 currents also increase and decrease, respectively. Therefore, at higher temperatures, the "saturation" base current 54 of the output BJT 28 is primarily dependent upon the emitter current 48 of the input BJT 24, rather than the source currents 50, 52 of the MOSFETs 42, 46.

The net effect of the inverse temperature dependencies of the conductivities of the input BJT 24 as compared to the MOSFETs 42, 46 is that the input-to-output signal propagation delay remains substantially constant. A preferred embodiment of the circuit 40 of the present invention maintains an input-to-output signal propagation delay variation in the range of 1-1.5 nanoseconds over an operating temperature range of $-55°$ C. to $+125°$ C.

It should be understood that various alternatives to the embodiments of the present invention described herein may be employed in practicing the present invention. It is intended that the following claims define the scope of the present invention and that structures and methods within the scope of these claims and their equivalents be covered thereby.

What is claimed is:

1. A signal line driver circuit for sinking a dc signal current to circuit ground in a temperature-compensated manner, said signal line driver circuit comprising:
   an output transistor coupled for sinking a first portion of said dc signal current to circuit ground, said output transistor having a drive signal input and an output current, said output transistor conducting said first portion of said dc signal current as said output current;
   a first input transistor coupled for receiving a first input signal and a second portion of said dc signal current and for sourcing a first portion of said drive signal, said first portion of said drive signal being substantially dependent upon said first input signal and substantially proportional to temperature, and further being substantially proportional to said second portion of said dc signal current; and
   a second input transistor coupled for receiving a second input signal and a third portion of said dc signal current and for sourcing a second portion of said drive signal, said second portion of said drive signal being substantially dependent upon said second input signal and substantially inversely proportional to temperature, and further being substantially proportional to said third portion of said dc signal current.

2. A signal line driver circuit as recited in claim 1, wherein said output transistor comprises a bipolar junction transistor having a base, emitter and collector, and further wherein said drive signal comprises an electrical current into said base of said bipolar junction transistor and said output current comprises an electrical current through said collector of said bipolar junction transistor.

3. A signal line driver circuit as recited in claim 1, wherein said first input transistor comprises a bipolar junction transistor having a base, emitter and collector, said base coupled to receive said first input signal, said first input signal comprising an electrical current, said collector coupled to receive said second portion of said dc signal current, and said emitter coupled to source a first drive current comprising said first portion of said drive signal.

4. A signal line driver circuit as recited in claim 1, wherein said second input transistor comprises a field effect transistor having a gate, source and drain, said gate coupled to receive said second input signal, said second input signal comprising a voltage, said drain coupled to receive said third portion of said dc signal current, and said source coupled to source a second drive current comprising said second portion of said drive signal.

5. A signal line driver circuit as recited in claim 4, wherein said field effect transistor comprises a metal oxide semiconductor field effect transistor.

6. A signal line driver circuit as recited in claim 1, wherein said signal line driver circuit further comprises a diode having an anode and a cathode, said anode coupled to said input transistors and said cathode coupled to said output transistor.

7. A signal line driver means for receiving an input signal and sinking an output signal current to circuit ground in a temperature-compensated manner, said signal line driver means comprising:
   output current sinking means for sinking a first portion of said output signal current to circuit ground, said output current sinking means having a buffered input signal and an output current, said output current sinking means conducting said first portion of said output signal current as said output current;
   a first input transistor having conductivity substantially proportional to temperature for buffering said input signal, said first input transistor having an input terminal coupled to receive said input signal, an output terminal coupled to source said buffered input signal, and a supply terminal coupled to receive a second portion of said output signal current as the current supply therefor; and
   a second input transistor having conductivity substantially inversely proportional to temperature, an input terminal coupled to receive said input signal, an output terminal coupled to said output terminal of said first input transistor, and a supply terminal coupled to said supply terminal of said first input transistor;
   wherein said second portion of said output signal current divides further into third and fourth portions of said output signal current, said third portion comprising supply terminal current for said first input transistor and said fourth portion comprising an electrical current through said supply terminal of said second input transistor, and further wherein said output terminal of said first input transistor and said output terminal of said second input transistor are coupled together to source said buffered input signal, said buffered input signal comprising the sum of first and second driver currents which are substantially equal to said third and fourth portions of said output signal current, respectively.

8. A signal line driver circuit for sinking a signal current to circuit ground in a temperature-compensated manner, said signal line driver circuit comprising:

an output transistor coupled for sinking a first portion of said signal current to circuit ground, said output transistor having a drive signal input and an output current, said output transistor conducting said first portion of said signal current as said output current;

a first input transistor coupled for receiving a first input signal and a second portion of said signal current and for sourcing a first portion of said drive signal, said first portion of said drive signal being substantially dependent upon said first input signal and substantially proportional to temperature, and further being substantially proportional to said second portion of said signal current;

a second input transistor coupled for receiving a second input signal and a third portion of said signal current and for sourcing a second portion of said drive signal, said second portion of said drive signal being substantially dependent upon said second input signal and substantially inversely proportional to temperature, and further being substantially proportional to said third portion of said signal current; and a third input transistor coupled for receiving a third input signal and a fourth portion of said signal current and for sourcing a third portion of said drive signal, said third portion of said drive signal being substantially dependent upon said third input signal and further being substantially proportional to said fourth portion of said signal current.

9. A signal line driver means for receiving an input signal and sinking an output signal current to circuit ground in a temperature-compensated manner, said signal line driver means comprising:

output current sinking means for sinking a first portion of said output signal current to circuit ground, said output current sinking means having a buffered input signal and an output current, said output current sinking means conducting said first portion of said output signal current as said output current;

a first input transistor having conductivity substantially proportional to temperature for buffering said input signal, said first input transistor having an input terminal coupled to receive said input signal, an output terminal coupled to source said buffered input signal, and a supply terminal coupled to receive a second portion of said output signal current as the current supply therefor;

a second input transistor having conductivity substantially inversely proportional to temperature, an input terminal coupled to receive said input signal, an output terminal coupled to said output terminal of said first input transistor, and a supply terminal coupled to said supply terminal of said first input transistor; and a third input transistor having conductivity substantially inversely proportional to temperature, an input terminal, an output terminal and a supply terminal, said input terminal coupled to receive said input signal, said supply terminal coupled to said supply terminal of said first input transistor and said output terminal coupled to said output terminal of said first input transistor;

wherein said second portion of said output signal current divides further into third, fourth and fifth portions of said output signal current, said third portion comprising supply terminal current for said first input transistor, said fourth portion comprising supply terminal current for said second input transistor and said fifth portion comprising supply terminal current for said third input transistor, and further wherein said output terminal of said first input transistor, said output terminal of said second input transistor and said output terminal of said third input transistor are coupled together to source said buffered input signal, said buffered input signal comprising the sum of first, second and third driver currents which are substantially equal to said third, fourth and fifth portions of said output signal current, respectively.

10. A signal line driver means for receiving an input signal and sinking a dc output signal current to circuit ground, said signal line driver means comprising:

output current sinking means for sinking a first portion of said dc output signal current to circuit ground, said output current sinking means having a buffered input signal and an output current, said output current sinking means conducting said first portion of said dc output signal current as said output current; and temperature-compensated input signal buffering means for buffering said input signal, said temperature-compensated input signal buffering means receiving said input signal and sourcing said buffered input signal, said temperature-compensated input signal buffering means further receiving a second portion of said dc output signal current as the current supply therefor, wherein said buffered input signal is approximately constant over substantial variations in temperature;

wherein said temperature-compensated input signal buffering means comprises:

a first input transistor having an input terminal, an output terminal and a supply terminal, said input terminal coupled to receive said input signal, said supply terminal coupled to receive said second portion of said dc output signal current and said output terminal coupled to source said buffered input signal; and a second input transistor having an input terminal, an output terminal and a supply terminal, said input terminal coupled to receive said input signal, said supply terminal coupled to said supply terminal of said first input transistor and said output terminal coupled to said output terminal of said first input transistor, wherein said second portion of said dc output signal current divides further into third and fourth portions of said dc output signal current, said third portion comprising said supply terminal current of said first input transistor and said fourth portion comprising an electrical current through said supply terminal of said second input transistor, and further wherein said output terminal of said first input transistor and said output terminal of said second input transistors are coupled together to source said buffered input signal, said buffered input signal comprising the sum of first and second driver currents which are substantially equal to said third and fourth portions of said dc output signal current, respectively.

11. A signal driver means as recited in claim 10, wherein said output terminal of said second input transistor is coupled to said output terminal of said first input transistor via a resistor.

12. A signal line driver means as recited in claim 10 or 11, wherein said second input transistor comprises a metal oxide semiconductor field effect transistor.

13. A signal line driver means as recited in claim 10 or 11, wherein said temperature-compensated input signal buffering means further comprises a third input transistor having an input terminal, an output terminal and a supply terminal, said input terminal coupled to receive said input signal, said supply terminal coupled to said supply terminal of said first input transistor and said output terminal coupled to said output terminal of said first input transistor, further wherein said second portion of said dc output signal current divides further into third, fourth and fifth portions of said dc output signal current, said third portion comprising said supply terminal current of said first input transistor, said fourth portion comprising said supply terminal current of said second input transistor and said fifth portion comprising said supply terminal current of said third input transistor, and further wherein said output terminal of said first input transistor, said output terminal of said second input transistor and said output terminal of said third input transistor are coupled together to source said buffered input signal, said buffered input signal comprising the sum of first, second and third driver currents which are substantially equal to said third, fourth and fifth portions of said dc output signal current, respectively.

14. A signal line driver means as recited in claim 13, wherein said third input transistor comprises a metal oxide semiconductor field effect transistor.

15. A signal line driver circuit for sinking a dc signal current to circuit ground in a temperature-compensated manner, said signal line driver circuit comprising:
an output transistor coupled for sinking a first portion of said dc signal current to circuit ground, said output transistor having a drive signal input and an output current, said output transistor conducting said first portion of said dc signal current as said output current;
a first input transistor coupled for receiving a first input signal and a second portion of said dc signal current and for sourcing a first portion of said drive signal, said first portion of said drive signal being substantially dependent upon said first input signal and substantially proportional to temperature, and further being substantially proportional to said second portion of said dc signal current;
a second input transistor coupled for receiving a second input signal and a third portion of said dc signal current and for sourcing a second portion of said drive signal, said second portion of said drive signal being substantially dependent upon said second input signal and substantially inversely proportional to temperature, and further being substantially proportional to said third portion of said dc signal current; and
a third input transistor coupled for receiving a third input signal and a fourth portion of said dc signal current and for sourcing a third portion of said drive signal, said third portion of said drive signal being substantially dependent upon said third input signal and further being substantially proportional to said fourth portion of said dc signal current.

16. A signal line drive circuit as recited in claim 15, wherein said output transistor comprises a bipolar junction transistor having a base, emitter and collector, and further wherein said drive signal comprises an electrical current into said base of said bipolar junction transistor and said output current comprises an electrical current through said collector of said bipolar junction transistor.

17. A signal line driver circuit as recited in claim 15, wherein said first input transistor comprises a bipolar junction transistor having a base, emitter and collector, said base coupled to receive said first input signal, said first input signal comprising an electrical current, said collector coupled to receive said second portion of said dc signal current, and said emitter coupled to source a first drive current comprising said first portion of said drive signal.

18. A signal line driver circuit as recited in claim 15, wherein said second input transistor comprises a field effect transistor having a gate, source and drain, said gate coupled to receive said second input signal, said second input signal comprising a voltage, said drain coupled to receive said third portion of said dc signal current, and said source coupled to source a second drive current comprising said second portion of said drive signal.

19. A signal line driver circuit as recited in claim 18, wherein said field effect transistor comprises a metal oxide semiconductor field effect transistor.

20. A signal line driver circuit as recited in claim 15, wherein said third input transistor comprises a field effect transistor having a gate, source and drain, said gate coupled to receive said third input signal, said third input signal comprising a voltage, said drain coupled to receive said fourth portion of said dc signal current, and said source coupled to source a third drive current comprising said third portion of said drive signal.

21. A signal line driver circuit as recited in claim 20, wherein said field effect transistor comprises a metal oxide semiconductor field effect transistor.

22. A signal line driver circuit as recited in claim 15, wherein said signal line driver circuit further comprises a diode having an anode and a cathode, said anode coupled to said input transistors and said cathode coupled to said output transistor.

23. A method for sinking a dc output signal current to circuit ground in a temperature-compensated manner, said method comprising the steps of:
receiving an input signal;
using a first portion of said dc output signal current as a first current supply;
buffering said input signal and generating a first buffered input signal which is substantially proportional to temperature, while drawing current from said first current supply therefor;
using a second portion of said dc output signal current as a second current supply;
buffering said input signal and generating a second buffered input signal which is substantially inversely proportional to temperature, while drawing current from said second current supply therefor;
using a third portion of said dc output signal current as a third current supply;
buffering said input signal and generating a third buffered input signal, while drawing current from said third current supply therefor;
combining said first, second and third buffered input signals to generate a buffered drive signal; and
using said buffered drive signal to drive an output transistor for sinking the remainder of said dc output signal current.

24. A method as recited in claim 23, further comprising the steps of:
   using a bipolar junction transistor for using said first portion of said dc output signal current, buffering said input signal and generating said first buffered input signal;
   using a metal oxide semiconductor field effect transistor for using said second portion of said dc output signal current, buffering said input signal and generating said second buffered input signal; and
   using a bipolar junction transistor as said output transistor for sinking said remainder of said dc output signal current.

25. A method as recited in claim 24, further comprising the step of:
   using a metal oxide semiconductor field effect transistor for using said third portion of said dc output signal current, buffering said input signal and generating said third buffered input signal.

26. A method as recited in claim 23, further comprising the step of:
   using a metal oxide semiconductor field effect transistor for using said third portion of said dc output signal current, buffering said input signal and generating said third buffered input signal.

27. A method for sinking a dc output signal current to circuit ground in a temperature-compensated manner, said method comprising the steps of:
   receiving an input signal;
   using a first portion of said dc output signal current as a first current supply for a first bipolar junction transistor;
   buffering said input signal with said first bipolar junction transistor and generating a first buffered input signal which is substantially proportional to temperature, while drawing current from said first current supply therefor;
   using a second portion of said dc output signal current as a second current supply for a metal oxide semiconductor field effect transistor;
   buffering said input signal with said metal oxide semiconductor field effect transistor and generating a second buffered input signal which is substantially inversely proportional to temperature, while drawing current from said second current supply therefor;
   combining said first and second buffered input signals to generate a buffered drive signal; and
   using said buffered drive signal to drive a polar junction transistor as an output transistor for sinking the remainder of said dc output signal current.

28. A method as recited in claim 27, further comprising the step of:
   using a metal oxide semiconductor field effect transistor for using a third portion of said dc output signal current, buffering said input signal and generating a third buffered input signal.

* * * * *

UNITED STATES PATENT AND TRADEMARK OFFICE
CERTIFICATE OF CORRECTION

PATENT NO. : 5,247,207
DATED : September 21, 1993
INVENTOR(S) : Joseph D. Wert and Timothy D. Davis It is certified that error appears in the above - identified patent and that said Letters Patent is hereby corrected as shown below:

IN THE CLAIMS;

In Col. 10, line 59, delete "transistors" and replace with --transistor--.

In Col. 10, line 65, after "signal" insert --line--.

In Col. 14, line 20, delete "polar" and replace with --bipolar--.

Signed and Sealed this

Nineteenth Day of April, 1994

Attest:

BRUCE LEHMAN

*Attesting Officer*  *Commissioner of Patents and Trademarks*